United States Patent
Merchia et al.

(10) Patent No.: US 7,756,817 B2
(45) Date of Patent: Jul. 13, 2010

(54) SYSTEM AND METHOD FOR ENABLING PARALLEL ACCESS TO SERIALLY COMPRESSED FILES

(75) Inventors: Ambikeshwar Raj Merchia, Cupertino, CA (US); Donovan Schneider, San Francisco, CA (US); Venkatesan Ramachandran, Fremont, CA (US); Sunil Nagaraj, Sunnyvale, CA (US)

(73) Assignee: Yahoo! Inc., Sunnyvale, CA (US)

( * ) Notice: Subject to any disclaimer, the term of this patent is extended or adjusted under 35 U.S.C. 154(b) by 249 days.

(21) Appl. No.: 11/773,663

(22) Filed: Jul. 5, 2007

(65) Prior Publication Data
US 2009/0012982 A1    Jan. 8, 2009

(51) Int. Cl.
*G06F 17/00* (2006.01)
(52) U.S. Cl. ................ 707/102; 707/100; 707/101
(58) Field of Classification Search .......... 707/100–102
See application file for complete search history.

(56) References Cited

U.S. PATENT DOCUMENTS

| | | | | |
|---|---|---|---|---|
| 2007/0143564 A1* | 6/2007 | Uppala | ........................ | 711/173 |
| 2008/0154928 A1* | 6/2008 | Bashyam et al. | ............ | 707/101 |

* cited by examiner

*Primary Examiner*—Sana Al-Hashemi
(74) *Attorney, Agent, or Firm*—Seth H. Ostrow; Ostrow Kaufman & Frankl LLP

(57) ABSTRACT

The present invention is directed towards systems and methods for generating a compressed data file providing access to one or more selected portions of data contained within the data file. The file is partitioned into one or more chunks, a given chunk comprising a separate unit of data representing a subset of data from the file. The one or more chunks are compressed through use of a compression algorithm, and the one or more chunks are combined to form a compressed file. Metadata is also generated that indicates a chunk offset of a given chunk, thereby allowing direct parallel access to one or more given chunks. Similarly, legacy applications may ignore the chunk structure in the compressed file and access the file according to techniques know in the art, thereby preserving backwards compatibility with such legacy applications.

21 Claims, 4 Drawing Sheets

SYSTEM AND METHOD FOR ENABLING PARALLEL ACCESS TO SERIALLY COMPRESSED FILES

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF INVENTION

The invention disclosed herein relates generally to compression and decompression of data. More specifically, the present invention is directed to systems and methods for providing parallel access to compressed data while maintaining backwards compatibility with legacy decompression utilities.

BACKGROUND OF THE INVENTION

As the field of computing rapidly expands, the ability to compress and decompress large amounts of data for transfer and storage becomes a non-trivial necessity. Many applications require the use of extremely large sets of data, which often result in slow access and processing speeds. Increasing parallelism in computing (e.g., multi-threading) has lead to a dramatic increase in performance of existing applications by allowing an application to run concurrent threads simultaneously.

Given a large file containing rows of variable or fixed-width length data, current compression techniques do not store information regarding chunk offsets of individual pieces of data. Current techniques in the art compress a chunk of bytes, rather than a chunk of rows. This technique of compressing bytes ignores the structure of data stored in rows and thus ignores the regularities that a row-based data file enjoys. For example, a row-based data file may contain a column of data containing a key value. A large data file may be partitioned and compressed according to the key value. The absence of missing offset data requires a decompression utility to decompress an entire file before accessing data, as the missing offsets eliminate the possibility for random-access to the compressed file. Decompression is a serial operation and serial operations do not exploit the benefits of a multi-threaded or multi-process environment as they by nature stall the operation of threads or processes requiring access to the uncompressed data. For smaller compressed files the single-threaded approach to decompression does not present a considerable problem, but as larger and larger data files are utilized by modern applications, the delay caused by a single-threaded approach constitutes a significant performance problem. Therefore, there is a need in the art for a technique to allow for parallel access to data stored within a compressed file.

SUMMARY OF THE INVENTION

The present invention is directed towards methods and systems for generating a compressed data file providing access to one or more selected portions of data contained within the data file. The method of the present invention comprises partitioning the a data file into one or more chunks, a given chunk comprising a subset of data of a given file.

The partitioning of the compressed data file may comprise partitioning the compressed data file through use of a best-fit mode, in accordance with a predetermined size, through use of a flat divide scheme, hashing algorithm, range partitioning algorithm or round robin scheduling algorithm.

In a one embodiment, the partitioning of a file into one or more chunks comprises identifying a size threshold of a given chunk and partitioning the file into one or more chunks not exceeding the identified size threshold. In an alternative embodiment, partitioning a file into one or more chunks comprises generating metadata associated with a given chunk. The generated metadata may comprise the chunk offset of a given chunk. In one embodiment, the chunk offset may comprise a beginning and an end of a given chunk. In further embodiment, generating metadata associated with a given chunk may comprise generating a table maintaining the chunk offset associated with the chunk.

The one or more chunks are compressed using a compression algorithm. According to one embodiment, a DEFLATE algorithm is used to compress individual chunks. The one or more chunks are combined to form a compressed file. Combining the one or more chunks may comprise concatenating the one or more chunks. Alternatively, or in conjunction with the foregoing, combining the one or more chunks may comprise appending metadata associated with the one or more chunks to the file associated with the one or more chunks. According to one embodiment, combining the one or more chunks may comprise appending metadata associated with the one or more chunks.

According to one embodiment, the method of the present invention further comprises receiving a compressed file partitioned into one or more chunks and decompressing one or more of the chunks into which the file is partitioned. In one embodiment of the present invention, decompressing the one or more chunks into which a file is partitioned comprises decompressing the one or more chunks serially. In an alternative embodiment of the present invention, decompressing the one or more chunks into which a file is partitioned comprises decompressing the one or more chunks in parallel. In a further alternative embodiment, decompressing the one or more chunks into which a file is partitioned comprises identifying chunk offsets associated with a given chunk and decompressing the given chunk through use of the identified chunk offsets.

The present invention is further directed towards a system for generating a compressed data file. The system of the present invention comprises a file compression unit operative to partition a file into one or more chunks, a given chunk comprising a separate unit of data representing a subset of data from the file. The file compression unit may be operative to partition a file into one or more chunks based on a predetermined size, through use of a best-fit mode, a flat divide scheme, a hashing algorithm, range partitioning or round-robin scheduling. The file compression unit may further be operative to generate metadata indicating a chunk offset of a given chunk. According to an alternative embodiment, the file compression unit may be operative to generate a table maintaining the chunk offset associated with a given chunk.

According to one embodiment of the invention, the system of the present invention further comprises a concatenation unit operative to concatenate the one or more chunks of a given file and append the metadata associated with the one or more chunks to the file with which the one or more chunks are associated. According to one embodiment, the system of the present invention may further comprise a chunk compression unit operable to compress the one or more chunks of a given file using a DEFLATE algorithm. A file completion unit is operative to provide the chunked data file.

According to one embodiment of the invention, the system of the present invention further comprises a decompression unit operative to receive a compressed file partitioned into one or more chunks, and to decompress one or more of the chunks into which the file is partitioned. In one embodiment, the decompression unit may be operative to decompress the one or more chunks into which a file is partitioned serially.

In an alternative embodiment, the decompression unit may be operative to decompress the one or more chunks into which a file is partitioned in parallel. In a further alternative embodiment, the decompression unit may be operative to identify chunk offsets associated with a given chunk and decompress the given chunk through use of the identified chunk offsets.

BRIEF DESCRIPTION OF THE DRAWINGS

The invention is illustrated in the figures of the accompanying drawings which are meant to be exemplary and not limiting, in which like references are intended to refer to like or corresponding parts, and in which.

DETAILED DESCRIPTION OF THE PREFERRED EMBODIMENTS

In the following description, reference is made to the accompanying drawings that form a part hereof, and in which is shown by way of illustration specific embodiments in which the invention may be practiced. It is to be understood that other embodiments may be utilized and structural changes may be made without departing from the scope of the present invention.

Figure 1:
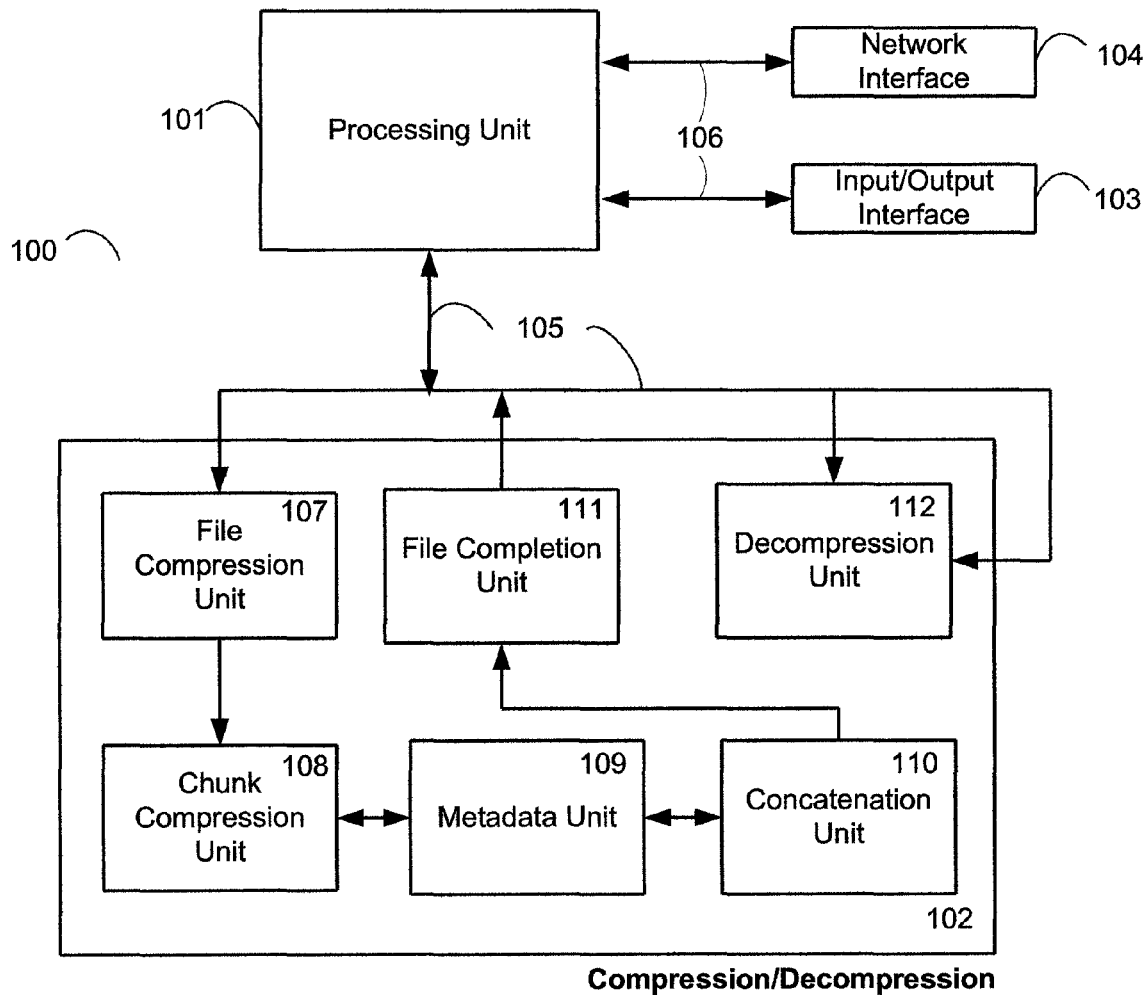
FIG. 1 is a block diagram illustrating a system for compressing and/or decompressing data files according to one embodiment of the present invention.

FIG. 1 presents a block diagram depicting one embodiment of a system for compressing and decompressing large data files. According to the embodiment illustrated in FIG. 1, a compression/decompression unit 102 is communicatively coupled to a data path 105 which is in turn coupled with a processing unit 101.

The processing unit 101 comprises a main processing unit capable of performing standard data processing as known to one of ordinary skill in the art. Standard data processing may consist of communicating with input and output devices, communicating with network elements, standard arithmetic and floating point operations and other functions known in the art. For example, processing unit 101 may consist of a Pentium processor manufactured by Intel Corporation, a PowerPC processor manufactured by IBM or any standard processor as known in the art. Additionally, processing unit 101 may be configured to contain local memory such as dynamic random access memory (DRAM) and static random access memory (SRAM) to store data necessary for processing. Processing unit 101 may also contain local storage such as hard disks, tape disks etc., as well as optical storage media mechanisms, such as a CD-ROM, DVD, etc.

The processing unit 101 is communicatively coupled to a network interface 104 and an input/output interface 103 via a bus 106. The network interface 104 may be constructed using various communications protocols, such as TCP/IP, and may be known by other terminology, including but not limited to a transceiver or network interface card ("NIC"). The network interface 104 is enabled to facilitate communications between the processing system 100 and client devices via local or wide area networks, such as the Internet. Client devices may comprise additional processing systems such as personal computers, printers, remote displays, etc. The input/output interface 103 may be operative to facilitate communication between the processing unit 101 and local input and/or output devices (not illustrated). Local input and output devices may comprise keyboards, mice, display monitors, printers, scanners, etc.

The processing unit 101 is coupled to the compression/decompression unit 102 via a communications bus 105. Although the compression/decompression unit 102 is shown as an external device to the processing unit 101, the compression/decompression unit 102 may also be resident within the processing unit 101, such as a module within the processing unit 101, or may be resident within any component comprising the processing unit 101. Those of skill in the art recognize that the compression/decompression unit 102 may be embodied as one or more software components. The communications bus 105 is illustrated as a bidirectional data bus such as PCI, HyperTransport, Infiniband, etc.

The compression/decompression (CODEC) unit 102 is coupled via the communications bus 105 to the processing unit 101. Although illustrated as one logical unit, the compression/decompression unit 102 may comprise separate units for compression and decompression. Separate compression and decompression units may reside in different logical elements within a processing environment. For example, the compression components of the CODEC unit 102 may reside in local memory within the processing unit 101, and the decompression components may reside in an external processing system coupled to the processing unit 101 via the network interface 104. Alternatively, or in conjunction with the foregoing, one or more CODEC units may reside in both the processing unit 101 and external processing units coupled to the processing unit 101 via the network interface 104 and/or the input/output interface 103. While the embodiment of FIG. 1 illustrates compression and decompression operations as being performed by the processing system 101, those of skill in the art recognize that other embodiments are within the scope of the present invention, including but not limited to embodiments in which compression is performed within the processing unit 101 and decompression is performed within an external processing system or unit.

The CODEC unit 102 may receive a data file via a file compression unit 107. The file compression unit 107 may be operative to partition the received file into "k" chunks containing the data received by the CODEC unit 102. According to one embodiment of the present invention, the value of "k" is chosen to be a value that yields the optimum chunk size. The value of "k" may be determined independently for each chunk, wherein, the value of "k" may vary depending on properties of the chunk or by pre-defined criteria. For example, if the optimum chunk size for a given file is 16 MB of data and a file under inspection contains 44 MB data, a value of "k" may be determined as the ceiling of (44/16) MB (e.g., three (3)). Those of ordinary skill in the art recognize the plurality of techniques for determining the value of "k" given an optimum chunk size (e.g., "best-fit").

The partitioned file is then received by the chunk compression unit 108. The chunk compression unit 108 compresses the received data chunks utilizing a compression algorithm known in the art, which may comprise allowing for the concatenation of compressed files. For example, the chunk compression unit 108 may employ an algorithm such as DEFLATE, which is a popular compression algorithm utilized by the compression utility gzip. The use of a compression algorithm that allows for concatenation enables the compressed file to be decompressed in its entirety or in pieces.

While chunks are being compressed by chunk compression unit 108, metadata is generated by metadata unit 109. In accordance with one embodiment, the metadata generated by metadata unit 109 is operable to store the chunk offsets indicating the position of each chunk partitioned within the file. By storing metadata corresponding to each chunk within a file, sophisticated decompression methods may be enable to utilize the metadata to decompress a subset (chunk) of the file, without the need to decompress the entire file first. To preserve backwards compatibility with legacy applications, embodiments of a system in accordance with the present invention may store the metadata separate from the file, such as in a different file, file system, data store, etc., with a link or pointer between the file and the associated metadata. Accordingly, those clients that intend to access a given chunk in the file (as opposed to accessing the file in a serial fashion) may traverse the link or pointer to access the metadata for the file. Where backwards compatibility is not an issue, embodiments of the present invention contemplate modifying the compressed file for the inclusion of the metadata.

The chunk compression unit 108 may be operable to compress the data serially or in parallel depending upon implementation. If performed serially, each chunk may be compressed in the order it is received by the unit. For example, if the chunk compression unit 110 receives chunks C1, C2 and C3, chunk C1 is compressed followed by C2 and finally C3. If compression is to be performed in parallel, a chunk compression unit 110 may receive a plurality of chunks and compresses at least two of said chunks at the same time. For example, if chunks C1, C2 and C3 are received by the chunk compression unit 110, the chunk compression unit 110 may be operative to compress C1 and C2 concurrently. According to another embodiment, the chunk compression unit 110 may be configured to compress chunks C1, C2 and C3 or only chunks C2 and C3.

Alternatively, or in conjunction with the foregoing, metadata generated by metadata unit 109 may comprise data corresponding to key values of records at the chunk boundaries. For example, given a database of records containing a key column and a range partitioning scheme that forms chunks based on key columns, generated metadata may contain information related to the key column value of the first and last elements within the chunk. This scheme would allow a sophisticated client access to a specific chunk relating to a desired key column, thus allowing the client to access only a relevant subset, or chunk, of the compressed file.

Compressed chunks are thereafter received by a concatenation unit 110. The concatenation unit 110 is operative to concatenate chunks corresponding to a received data file while communicating with a metadata unit 109. The metadata unit 109 is operative to generate metadata comprising information used in the decompression of individual chunks. According to one embodiment, metadata comprises information utilized for locating the position of a chunk within a file, including but not limited to a chunk offset associated with a given chunk.

For example, a file may be divided into multiple chunks C1, C2 and C3. The concatenation unit 110 may be operative to concatenate C2 to C1 forming "C1C2". While C2 is concatenated to C1, the metadata unit 109 stores the offset of each chunk within the file. The offset for C1 may be inherently 0 and the offset for C2 may be offset of C1 plus the length of C1. This process is repeated for the one or more chunks within a given file. According to one embodiment, upon reaching the final chunk within a file, the metadata associated with the one or more chunks is attached to the concatenated chunks by the metadata unit 109. According to another embodiment, the metadata associated with the one or more chunks is attached to another position within the entire data file, such as at the beginning of the data file.

In alternative embodiments, the metadata generated by metadata unit 109 may comprise data corresponding to key values of records at the chunk boundaries. For example, given a database of records containing a key column and a range partitioning scheme that forms chunks based on key columns, generated metadata may contain information related to the key column value of the first and last elements within the chunk. This scheme would allow a sophisticated client access to a specific chunk relating to a desired key column, thus allowing the client to access only a relevant subset, or chunk, of the compressed file After the file is chunked and concatenated, the chunked file is sent to a file completion unit 111 where it is recognized as a completely compressed file. The final, chunked file may then be transmitted via bus 105 to processing unit 101.

A decompression unit 112 is operative to receive a compressed file and to decompress the file for use by a system. As stated previously, although decompression unit 112 is illustrated as residing within the combined CODEC unit 102, the decompression unit may also reside outside of the CODEC unit or within a separate system. Additionally, the decompression unit may be coupled to alternative data path, such as a local or wide area network or the input/output interface 103. As illustrated in the embodiment of FIG. 1, the decompression unit 112 receives a compressed file from the processing unit 101. The file received from the processing unit 101 may be compressed in accordance with the chunking method as described herein. However, the compressed file may also be compressed by standard compression means as known in the art, such as the DEFLATE algorithm. Accordingly the decompression unit 112 is backwards compatible with non-chunked compressed files and allows an application utilizing the decompression unit 112 to maintain compliance with non-chunked compression standards.

The decompression unit 112 receives the compressed file and decompresses the file in accordance with a predetermined method. This method may be selected by the user, an application, the file itself, etc. In one embodiment, a decompression method consists determining if a compressed file has been chunked. If the file has been chunked, a further check is performed to determine if the application or user wishes to exploit the chunking. If either of the two checks fail, decompression is performed in a serial manner as currently used in the art. If the application or user wishes to exploit chunking, metadata is retrieved corresponding to a requested chunk. The metadata contains information identifying the location of a given chunk within the compressed file and accordingly allows the application or user to retrieve the chunk from within the compressed file without the need to decompress the entire chunk or file. Similarly, chunk metadata may enable the decompression of an entire file in parallel.

Figure 2:
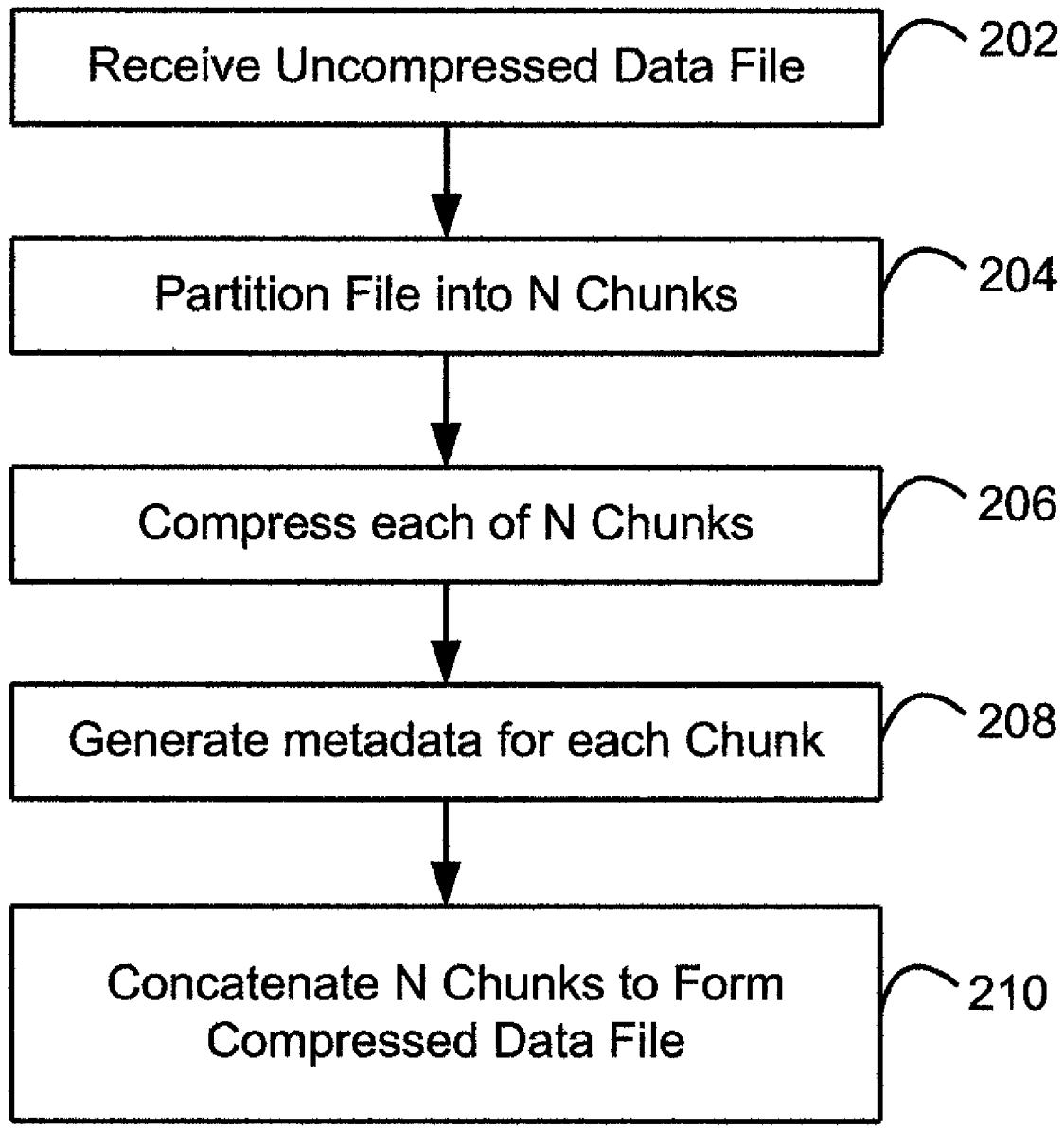
FIG. 2 is a flow diagram illustrating a method for partitioning and compressing a data file according to one embodiment of the present invention.

FIG. 2 is a flow diagram illustrating one embodiment of a method for performing compression of a given file. An uncompressed data file is received for compression, step 202. A received data file may comprise text, image, video, audio or any other data suitable for compression. A partitioning algorithm is performed on the uncompressed data file, step 204. The partitioning algorithm is operative to partition the uncompressed data file into N chunks, wherein the value of N is at least one. The selection of a value of N may be made based on a variety of criteria including, but not limited to, a user or by a setting residing within a compression mechanism. For example, a user may specify that files over 100 MB are to be divided into 10 chunks. Alternatively, or in conjunction with the foregoing, a user may specify that for files over 200 MB, chunks are to be created no larger than 10 MB.

After partitioning the uncompressed data file, a compression algorithm is applied to each chunk, step 203. The compression algorithm processes each received chunk. For example, the compression algorithm may comprise the DEFLATE algorithm or another compression algorithm known to those of skill in the art. While the embodiment of FIG. 2 illustrates the partitioning and compressing method performed sequentially, alternative embodiments are within the scope of the present invention in which partitioned files are compressed in parallel after partitioning.

While the chunks generated in step 202 are being compressed, metadata may be written to the compressed file, step 204. Metadata may be utilized to identify the location or position of a chunk within a compressed file and may act as an "index" for a compressed file. Although the generation of metadata is shown as occurring after a chunk is compressed, alternative embodiments exist wherein the generation of metadata occurs prior to compression or in parallel with the compression. For example, a metadata file may comprise a plurality of chunk offsets. This metadata allows a user or application to read the requested chunk without having to decompress the entire file. A user or application may refer to the metadata and extract a compressed chunk from within the data file.

Figure 3:
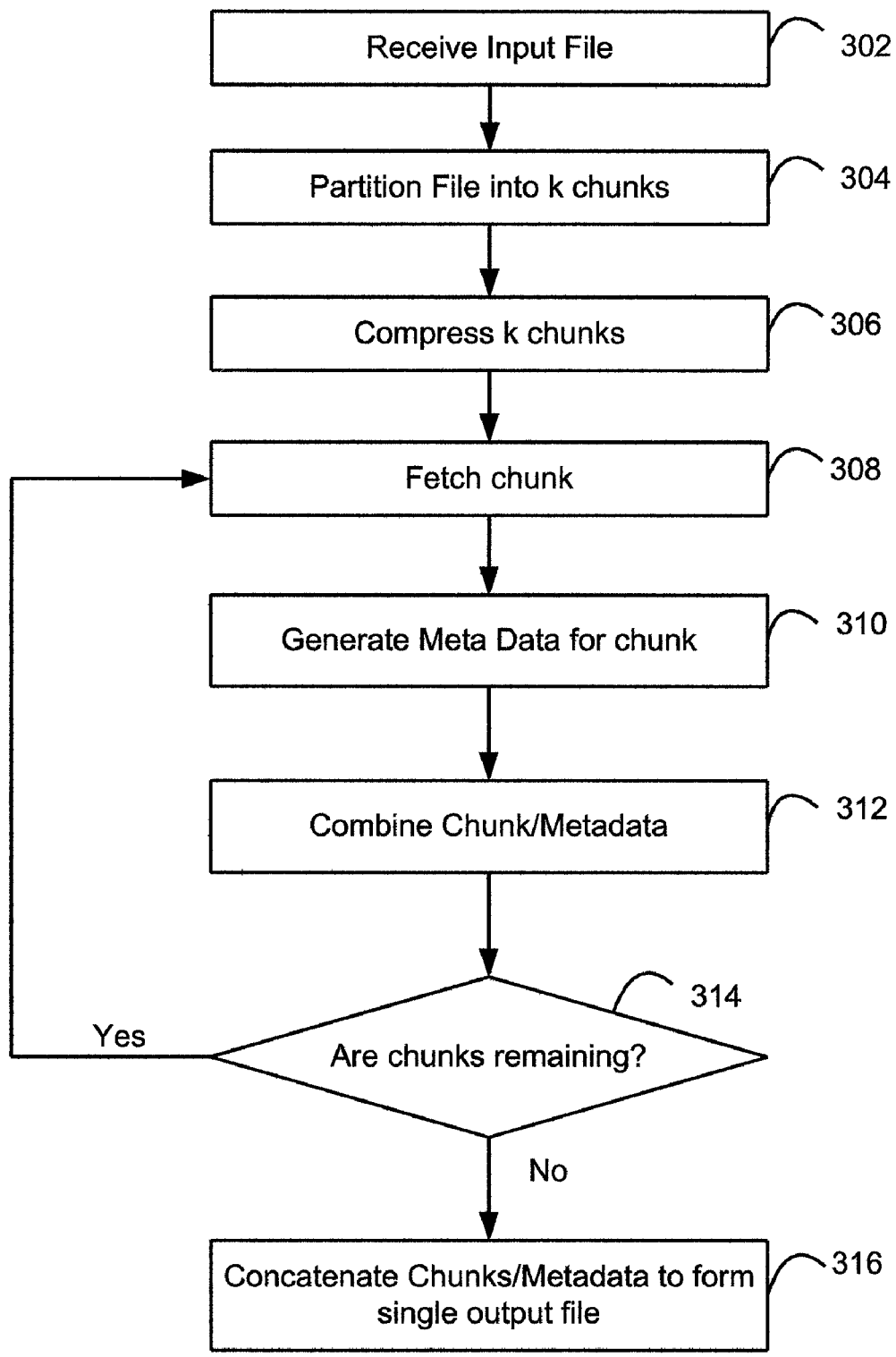
FIG. 3 is a flow diagram illustrating a method for partitioning one or more data file chunks according to one embodiment of the present invention.

FIG. 3 illustrates an embodiment of a method for partitioning and compressing one or more chunks comprising a given file. According to the embodiment illustrated in FIG. 3, an input file is received, step 302. A given input file may contain decompressed data that is deemed to violate a set condition for standard chunk requirements. This set condition may be set by a user, application, or other similar means including, but not limited to, a predetermined size limit. Upon receipt of a given data file, the file is partitioned into "k" chunks (e.g., C1, C2, C3 ... ), step 304. The determination of the size of "k" may be based upon techniques known to those skilled in the art. For example, a best-fit selection may be used wherein three chunks are formed for a partition of 44 MB, the chunks corresponding to 16 MB, 16 MB and 12 MB.

The one or more chunks into which the file is partitioned are compressed, step 306. In one embodiment, a chunk is compressed by locating redundant code within the chunk and simplifying the uncompressed chunk by replacing redundant code with a smaller representative code. For example, if a chunk contains the data "ABAA," wherein the letters "A" and "B" correspond to eight bits, a compressed version of the chunk could be compressed as 1011, where 1 and 0 are represented as single bits. A decompressor may contain a dictionary that maps the value of 1 to the eight bit code "A" and 0 to the eight bit code "B". The compressed code contains four bits, whereas the uncompressed version contains 32 bits, resulting in a compression rate of 1:8.

A given chunk may be selected from among the one or more chunks into which the file is partitioned, step 308. After a chunk is fetched, metadata is also generated regarding each chunk, step 310. Metadata is utilized to identify the location or position of a chunk within a compressed file and may act as an "index" for a compressed file. For example, a metadata file may comprise a plurality of chunk offsets. This metadata would allow a user or application to read the requested chunk without having to decompress the entire file. For example, when chunk C1 is compressed, a default chunk offset of 0 is created indicating that C1 is the first chunk within a partition. Thereafter, when C2 is compressed, a chunk offset is calculated by adding the length of C1 to the chunk offset of C1 (zero) to form the chunk offset of chunk C2. A user or application may refer to the metadata and extract a compressed chunk from within the data file.

After metadata has been generated for each chunk, the chunk and metadata are combined, step 312. In one embodiment, chunks may be combined to form one unit, such as a chunk/metadata file. In alternative embodiments, a running list of chunks and corresponding metadata may be maintained. The list may then be utilized to form a final compressed file containing a chunk section and a metadata section, as will be described in the following paragraphs.

After the chunk and metadata are combined (step 312) a check is performed to determine if more chunks remain to be inspected, step 314. If more chunks remain, the process repeats (steps 308-314). If no chunks are remaining, the chunks are then concatenated together (C1+C2+C3+ ... ), step 316.

According to one embodiment, the metadata generated in step 310 is appended onto the concatenated chunks, forming one cohesive chunk/metadata object. According to another embodiment, metadata may be combined within other parts of the compressed file. For example, metadata generated for a chunk in step 310 may be indexed into a table of metadata corresponding to an entire compressed file. This table of metadata may be indexed by a decompression unit to fetch the chunk offsets for a given file. This embodiment would allow the metadata and compressed data to be separate entities within a single file and thus be useable independently of each other.

Figure 4:
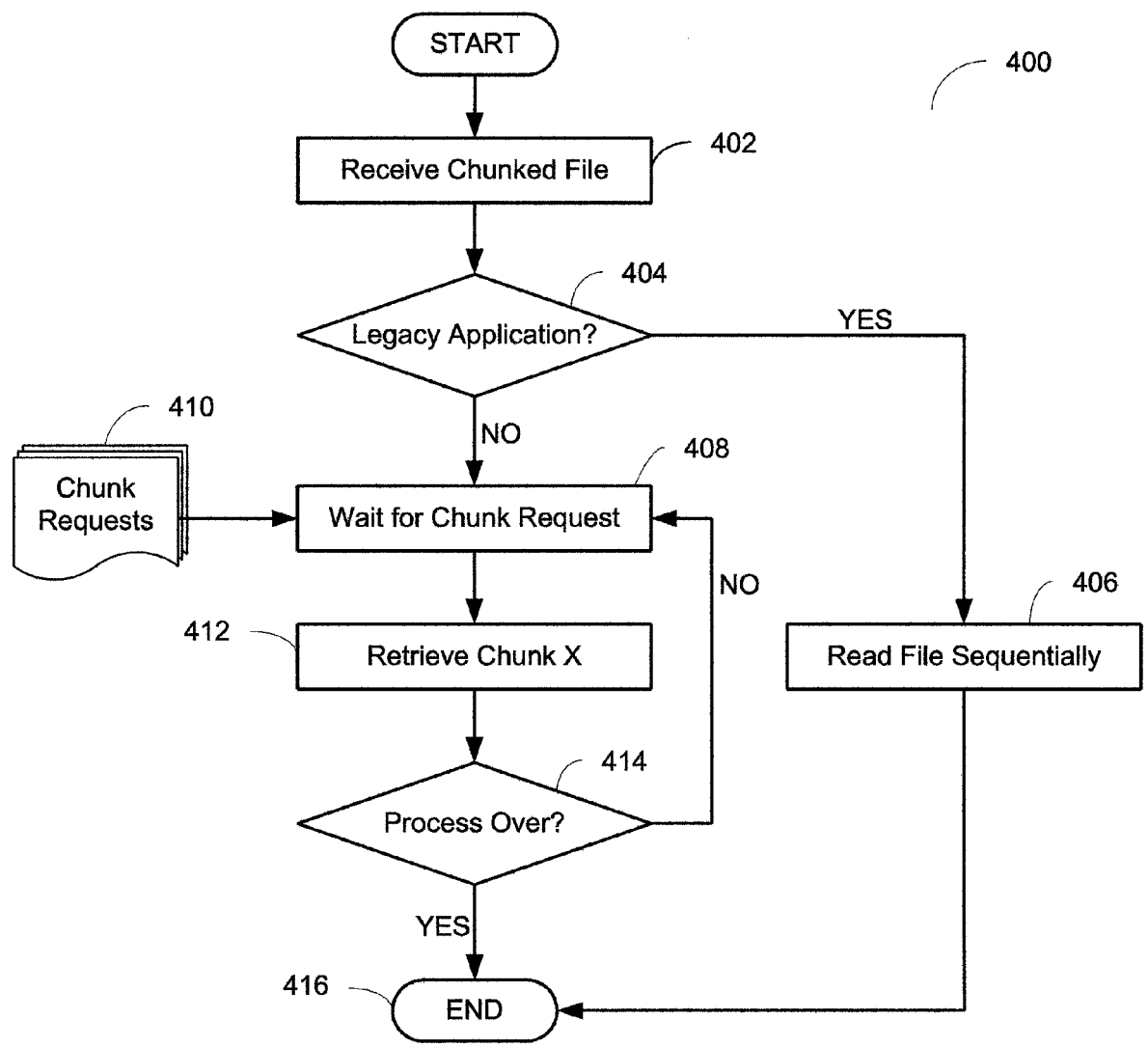
FIG. 4 illustrates one embodiment of a method for decompressing a compressed filed.

FIG. 4 illustrates one embodiment of a method for decompressing a compressed filed. As illustrated, a process 400 receives a chunked file, step 402. A chunk file may correspond to a compressed file generated by a method illustrated in FIGS. 2 and 3.

The process 400 first checks to determine if the application accessing the checked file is a legacy application, step 404. Check 404 ensures the backwards compatibility with applications, hardware and other devices utilizing legacy methods of decompression. For example, if an application utilizing decompression process 400 does not support the use of chunks within a compressed file, it may be necessary to read the complete file sequentially, step 406.

However, if the target application is operable to exploit the chunked file the process 400 continues to step 408 and waits for a chunk request 410. As illustrated, a file may be inactive until a chunk request 410 is sent to the file. For example, upon determining that a target application is not a legacy application, process 400 may wait for further instruction as to what chunks within the file are to be decompressed. In accordance with one embodiment, chunk requests 410 may be issued in parallel. That is, a request for chunk A may occur at the same time chunk B is requested, or during the time chunk B is being fetched.

When a chunk request 410 is received, the selected chunk is retrieved, step 412. In one embodiment, a chunk request 410 may comprise an identification of a chunk to receive (e.g., "retrieve chunk 42"). Process 400 may be operable to translate the chunk identification ("42") to a file offset (e.g., "84 bytes from file head") via a table or other translation means common in the art. The translation means may further comprise a length identification for each chunk. In an alternative embodiment, the file offset of the chunk immediately after the selected chunk may be utilized to determine the length of a selected chunk.

After a chunk is retrieved, process 400 checks to determine if it should end, step 414. In accordance with one embodiment, a target application, operating system or hardware element may send an end signal (such as a terminate or kill signal) to the process 400. The process 400 may be operative to determine if the process is able to end. For example, process 400 may determine if any file reads are taking place, and may perform a shut down clean up operation to gracefully exit the process.

FIGS. 1 through 4 are conceptual illustrations allowing for an explanation of the present invention. It should be understood that various aspects of the embodiments of the present invention could be implemented in hardware, firmware, software, or combinations thereof. In such embodiments, the various components and/or steps would be implemented in hardware, firmware, and/or software to perform the functions of the present invention. That is, the same piece of hardware, firmware, or module of software could perform one or more of the illustrated blocks (e.g., components or steps).

In software implementations, computer software (e.g., programs or other instructions) and/or data is stored on a machine readable medium as part of a computer program product, and is loaded into a computer system or other device or machine via a removable storage drive, hard drive, or communications interface. Computer programs (also called computer control logic or computer readable program code) are stored in a main and/or secondary memory, and executed by one or more processors (controllers, or the like) to cause the one or more processors to perform the functions of the invention as described herein. In this document, the terms "machine readable medium," "computer program medium" and "computer usable medium" are used to generally refer to media such as a random access memory (RAM); a read only memory (ROM); a removable storage unit (e.g., a magnetic or optical disc, flash memory device, or the like); a hard disk; electronic, electromagnetic, optical, acoustical, or other form of propagated signals (e.g., carrier waves, infrared signals, digital signals, etc.); or the like.

Notably, the figures and examples above are not meant to limit the scope of the present invention to a single embodiment, as other embodiments are possible by way of interchange of some or all of the described or illustrated elements. Moreover, where certain elements of the present invention can be partially or fully implemented using known components, only those portions of such known components that are necessary for an understanding of the present invention are described, and detailed descriptions of other portions of such known components are omitted so as not to obscure the invention. In the present specification, an embodiment showing a singular component should not necessarily be limited to other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The foregoing description of the specific embodiments will so fully reveal the general nature of the invention that others can, by applying knowledge within the skill of the relevant art(s) (including the contents of the documents cited and incorporated by reference herein), readily modify and/or adapt for various applications such specific embodiments, without undue experimentation, without departing from the general concept of the present invention. Such adaptations and modifications are therefore intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one skilled in the relevant art(s).

While various embodiments of the present invention have been described above, it should be understood that they have been presented by way of example, and not limitation. It would be apparent to one skilled in the relevant art(s) that various changes in form and detail could be made therein without departing from the spirit and scope of the invention. Thus, the present invention should not be limited by any of the above-described exemplary embodiments, but should be defined only in accordance with the following claims and their equivalents.

We claim:

1. A method for generating a compressed data file providing access to one or more selected portions of data contained within the data file, the method comprising:

partitioning a data file into a plurality of chunks, each chunk comprising a subset of data of a given file, wherein partitioning comprises partitioning a file into one or more chunks through use of a hashing algorithm;

compressing the chunks through use of a compression algorithm including generating metadata for each chunk and storing the metadata within a file and at a location separate from the file with a link or pointer to access the metadata, the storing at the location separate from the file allowing for backwards compatibility, the metadata including key value data of records at chunk boundaries, thereby allowing for direct access to one of the plurality of chunks of the data file; and combining the one or more chunks to form a compressed file.

2. The method of claim 1 wherein partitioning the file into one or more chunks comprises partitioning through use of a best-fit mode.

3. The method of claim 1 wherein partitioning the file into one or more chunks comprises partitioning in accordance with a predetermined size.

4. The method of claim 1 wherein partitioning comprises partitioning a file into one or more chunks through use of a range partitioning algorithm.

5. The method of claim 1 wherein partitioning comprises partitioning a file into one or more chunks through use of a round-robin algorithm.

6. The method of claim 1 wherein partitioning a file into one or more chunks comprises:

identifying a size threshold for a given chunk; and partitioning the file into one or more chunks not exceeding the identified size threshold.

7. The method of claim 1 wherein generating metadata associated with a given chunk comprises generating metadata indicating a chunk offset of a given chunk.

8. The method of claim 7 wherein generating metadata indicating a chunk offset of a given chunk comprises generating metadata indicating a beginning and an end of a given chunk.

9. The method of claim 7 wherein generating metadata associated with a given chunk comprises generating a table maintaining at least one of the chunk offset associated with the chunk and partitioning keys.

10. The method of claim 1 wherein combining the one or more chunks comprises concatenating the one or more chunks.

11. The method of claim 1 wherein combining the one or more chunks comprises appending metadata associated with the one or more chunks.

12. The method of claim 1 further comprising:
    receiving a compressed file partitioned into one or more chunks; and
    decompressing one or more of the chunks into which the file is partitioned.

13. The method of claim 12 wherein decompressing the one or more chunks into which a file is partitioned comprises decompressing the one or more chunks serially.

14. The method of claim 12 wherein decompressing the one or more chunks into which a file is partitioned comprises decompressing the one or more chunks in parallel.

15. The method of claim 12 wherein decompressing the one or more chunks into which a file is partitioned comprises:
    identifying chunk offsets associated with a given chunk; and
    decompressing the given chunk through use of the identified chunk offsets.

16. A system for generating a compressed data file providing access to one or more selected portions of data contained within the data file, the system comprising:

a file compression unit operative to partition a file into a plurality of chunks, each chunk comprising a subset of data of a given file, wherein partitioning comprises partitioning a file into one or more chunks through use of a hashing algorithm;

a concatenation unit operative to combine the one or more chunks into which the file is partitioned including compressing the chunks through use of a compression algorithm and generating metadata for each chunk and storing the metadata within a file and at a location separate from the file with a link or pointer to access the metadata, the storing at the location separate from the file allowing for backwards compatibility, the metadata including key value data of records at chunk boundaries, thereby allowing for direct access to one of the plurality of chunks of the data file; and a file completion unit operative to provide the chunked data file.

17. The system of claim 16 wherein the file compression unit is operative to partition a file into one or more chunks of a predetermined size.

18. The system of claim 16 wherein the file compression unit is operative to partition a file into one or more chunks through use of a best-fit mode.

19. The system of claim 16 wherein the chunk unit is operative to partition a file into one or more chunks through use of a range partitioning algorithm.

20. The system of claim 16 wherein the chunk unit is operative to partition a file into one or more chunks through use of a round-robin algorithm.

21. The system of claim 16 wherein the file compression unit is operative to generate the metadata indicating at least one of a chunk offset of a given chunk and partitioning keys.

* * * * *